United States Patent
Thompson et al.

(10) Patent No.: US 8,278,758 B1
(45) Date of Patent: Oct. 2, 2012

(54) MULTILEVEL RESERVOIRS FOR INTEGRATED CIRCUIT INTERCONNECTS

(75) Inventors: Carl V. Thompson, Acton, MA (US); Tongjai Chookajorn, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 85 days.

(21) Appl. No.: 12/431,783

(22) Filed: Apr. 29, 2009

(51) Int. Cl.
*H01L 23/48* (2006.01)
*H01L 23/52* (2006.01)
*H01L 29/40* (2006.01)

(52) U.S. Cl. .......... 257/758; 257/774; 257/E23.011; 257/E23.067; 257/E23.145; 257/E23.174

(58) Field of Classification Search .......... 257/758, 257/774, E23.011, E23.067, E23.145, E23.174
See application file for complete search history.

(56) References Cited

U.S. PATENT DOCUMENTS

| | | | | |
|---|---|---|---|---|
| 5,629,236 A * | 5/1997 | Wada et al. | | 438/607 |
| 5,900,735 A * | 5/1999 | Yamamoto | | 324/537 |
| 6,023,100 A | 2/2000 | Tao et al. | | |
| 6,069,078 A | 5/2000 | Weaver et al. | | |
| 6,245,675 B1 | 6/2001 | Liang et al. | | |
| 6,417,572 B1 * | 7/2002 | Chidambarrao et al. | | 257/773 |
| 6,515,366 B1 * | 2/2003 | Chiou et al. | | 257/758 |
| 6,725,433 B1 * | 4/2004 | Hau-Riege et al. | | 324/762.01 |
| 6,762,597 B1 * | 7/2004 | Hau-Riege et al. | | 324/71.1 |
| 6,803,662 B2 * | 10/2004 | Wang et al. | | 257/774 |
| 6,822,437 B1 * | 11/2004 | Hau-Riege et al. | | 324/762.03 |
| 6,849,463 B2 * | 2/2005 | Santini et al. | | 436/518 |
| 6,904,675 B1 | 6/2005 | Atakov et al. | | |
| 6,939,803 B2 | 9/2005 | Marathe et al. | | |
| 7,074,712 B2 | 7/2006 | Cho | | |
| 7,122,898 B1 * | 10/2006 | Yang et al. | | 257/751 |
| 7,227,244 B2 * | 6/2007 | Bjorkman et al. | | 257/635 |
| 7,288,462 B2 * | 10/2007 | Wu et al. | | 438/424 |
| 7,566,652 B2 * | 7/2009 | Lee et al. | | 438/626 |
| 2003/0116855 A1 * | 6/2003 | Wang et al. | | 257/774 |
| 2003/0226121 A1 * | 12/2003 | Yokogawa | | 716/1 |
| 2004/0067638 A1 * | 4/2004 | Hau-Riege | | 438/629 |
| 2004/0070078 A1 * | 4/2004 | Ho et al. | | 257/774 |
| 2005/0023694 A1 * | 2/2005 | Bjorkman et al. | | 257/758 |
| 2005/0206000 A1 * | 9/2005 | Aggarwal et al. | | 257/758 |
| 2006/0289994 A1 | 12/2006 | Greenberg et al. | | |
| 2008/0017989 A1 * | 1/2008 | Lee et al. | | 257/758 |

FOREIGN PATENT DOCUMENTS

| | | |
|---|---|---|
| JP | 2001-44196 A | 2/2001 |
| JP | 2002-76114 A | 3/2002 |
| JP | 2007-294586 A | 8/2007 |

OTHER PUBLICATIONS

Gan, C. L. et al., "Experimental Characterization and Modeling of the Reliability of Three-Terminal Dual-Damascene Cu Interconnect Trees," Journal of Applied Physics, Jul. 15, 2003, pp. 1222-1228, vol. 94, No. 2, American Institute of Physics.

* cited by examiner

*Primary Examiner* — Teresa M Arroyo

(74) *Attorney, Agent, or Firm* — Withrow & Terranova, P.L.L.C.

(57) ABSTRACT

Embodiments of an on-chip interconnect having a multilevel reservoir are provided. In general, the on-chip interconnect is an interconnect within an integrated circuit and includes an interconnect segment and a multilevel reservoir. The interconnect segment has an anode end and a cathode end. The multilevel reservoir is adjacent to the cathode end of the interconnect segment and operates as a reservoir of metal atoms. As such, any electromigration-induced void begins forming in the multilevel reservoir rather than the cathode end of the interconnect segment. As a result, a reliability of the on-chip interconnect is substantially improved as compared to that of traditional on-chip interconnects. In addition, by utilizing multiple levels of the integrated circuit, a volume of the multilevel reservoir is substantially increased as compared to a volume of a corresponding single-level reservoir.

13 Claims, 10 Drawing Sheets

MULTILEVEL RESERVOIRS FOR INTEGRATED CIRCUIT INTERCONNECTS

FIELD OF THE DISCLOSURE

This disclosure relates to integrated circuits and more specifically relates to on-chip interconnects for an integrated circuit.

BACKGROUND

Figure 1A:
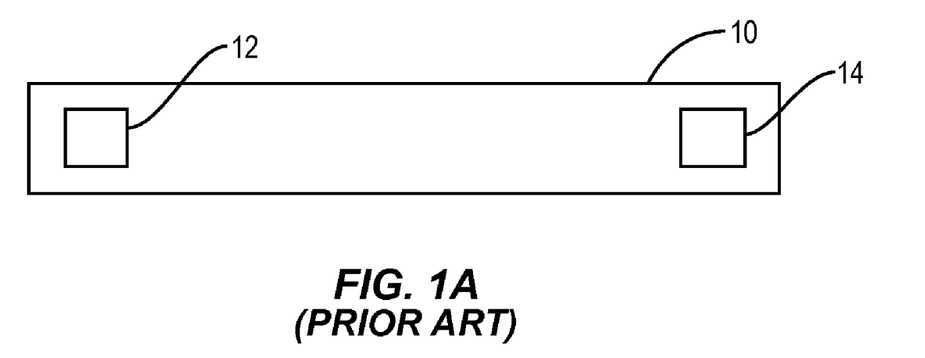
FIGS. 1A and 1B illustrate a traditional on-chip interconnect for an integrated circuit.
Figure 1B:
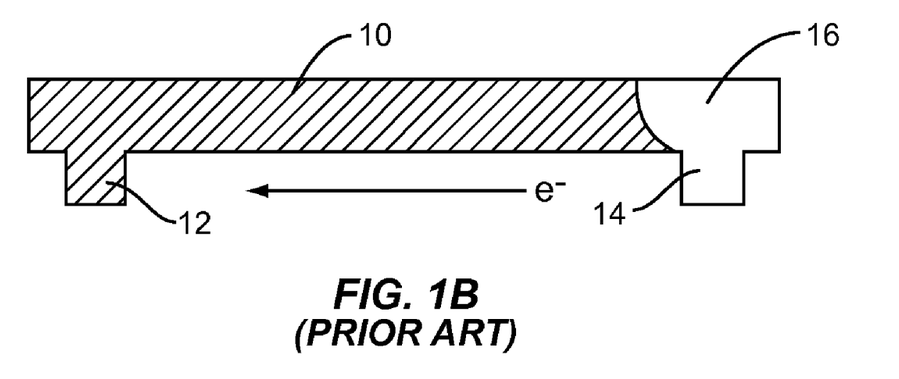

Advances in integrated circuit technology continuously demand increasing device and current densities. As a result, electromigration-induced failure of on-chip interconnects is becoming a critical reliability issue. With respect to an on-chip interconnect, electromigration-induced performance reduction or failure is a major concern. Electromigration is the transfer of material in the on-chip interconnect due to a momentum transfer between conducting electrons and diffusing metal atoms. The use of high current densities and densely packed on-chip interconnect structures in an integrated circuit results in electromigration-induced void formation. Specifically, FIG. 1A is a top down view of a traditional on-chip interconnect segment 10. The on-chip interconnect segment 10 is connected to another metal layer using vias 12 and 14. The term 'via' is commonly used as it is used here. However, the connections between metal layers are sometimes referred to as contacts. Both the on-chip interconnect segment 10 and the vias 12 and 14 are formed of a conductive material, namely, metal. Assuming that the via 12 is at an anode end of the on-chip interconnect segment 10 and the via 14 is at a cathode end of the on-chip interconnect segment 10, an electromigration-induced void 16 forms at the cathode of the on-chip interconnect segment 10. As the void 16 increases in size, a resistance of the on-chip interconnect segment 10 increases, thereby reducing performance. Eventually, the void 16 grows to a point that an open-circuit is created and a complete failure occurs, as illustrated in FIG. 1B. Thus, there is a need for a system and method reducing the effects of electromigration on the reliability of on-chip interconnects for an integrated circuit.

SUMMARY OF THE DETAILED DESCRIPTION

This disclosure provides embodiments of an on-chip interconnect for an integrated circuit and methods of fabricating the same. In general, the on-chip interconnect includes an interconnect segment and a multilevel reservoir. The interconnect segment has an anode end connected to a first node of an integrated circuit and a cathode end connected to a second node of the integrated circuit. The multilevel reservoir is adjacent to the cathode end of the interconnect segment and operates as a reservoir of metal atoms. As such, any electromigration-induced void begins forming in the multilevel reservoir rather than the cathode end of the interconnect segment. As a result, a reliability of the on-chip interconnect is substantially improved as compared to that of traditional on-chip interconnects. In addition, by utilizing multiple levels of the integrated circuit, a volume of the multilevel reservoir is substantially increased as compared to a volume of a corresponding single-level reservoir.

In one embodiment, an integrated circuit includes a substrate within which a number of electronic devices are formed, a contact layer formed over the substrate and providing electrical connections to the electronic devices, and interconnect layers formed over the contact layer. An on-chip interconnect including an interconnect segment and a multilevel reservoir is formed in the one or more interconnect layers. In one embodiment, the interconnect layers of the integrated circuit include a metal layer and a dielectric layer that is adjacent to the metal layer of the integrated circuit. The interconnect segment of the on-chip interconnect is formed in the metal layer. A first portion of the multilevel reservoir is formed in the metal layer adjacent to a cathode end of the interconnect segment, and a second portion of the multilevel reservoir is formed in the dielectric layer that is adjacent to the metal layer. The multilevel reservoir operates as a reservoir of metal atoms such that any electromigration-induced void begins forming in the multilevel reservoir rather than the interconnect segment. As a result, a reliability of the on-chip interconnect is substantially improved as compared to that of traditional on-chip interconnects. In addition, by utilizing multiple levels of the integrated circuit, a volume of the multilevel reservoir is substantially increased as compared to a volume of a corresponding single-level reservoir. This is done with minimal increase in the area used in the level of the interconnect segment.

Those skilled in the art will appreciate the scope of the present invention and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the invention, and together with the description serve to explain the principles of the invention.

DETAILED DESCRIPTION

The embodiments set forth below represent the necessary information to enable those skilled in the art to practice the invention and illustrate the best mode of practicing the invention. Upon reading the following description in light of the accompanying drawings, those skilled in the art will understand the concepts of the invention and will recognize applications of these concepts not particularly addressed herein. It should be understood that these concepts and applications fall within the scope of the disclosure and the accompanying claims.

Figure 2A:
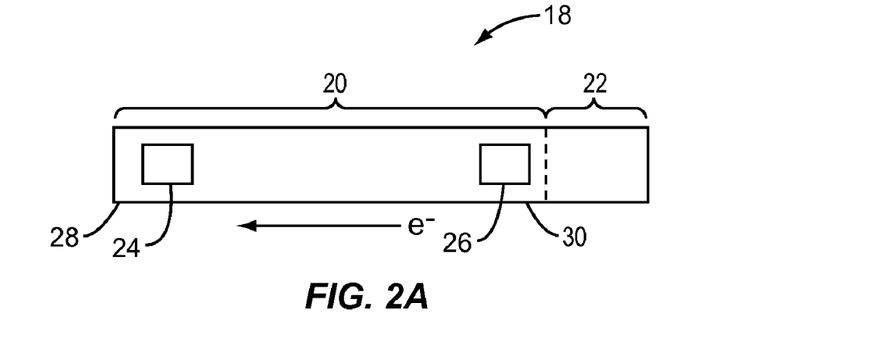
FIGS. 2A through 2C illustrate an on-chip interconnect for an integrated circuit where the on-chip interconnect has a multilevel reservoir according to one embodiment of this disclosure.
Figure 2B:
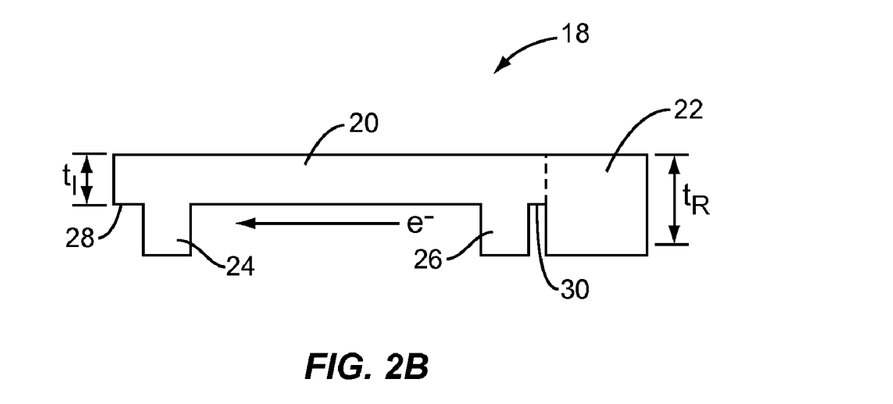
Figure 2C:
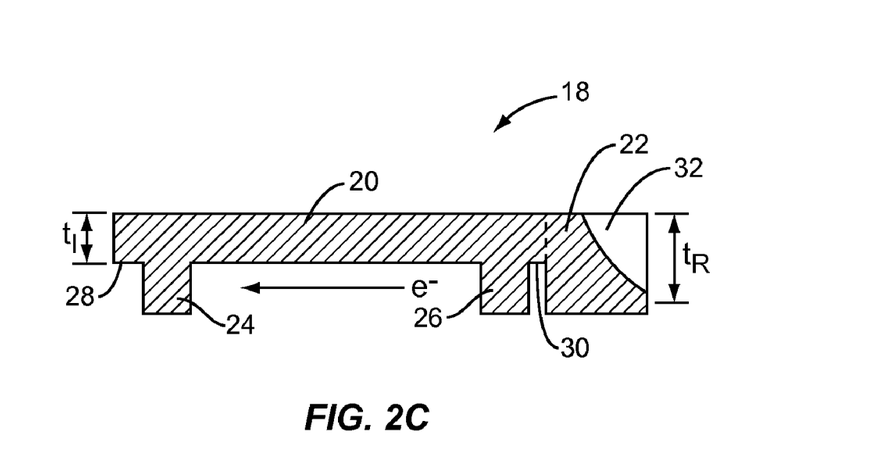

This disclosure provides embodiments of an on-chip interconnect for an integrated circuit having a multilevel reservoir and methods of fabricating the same. FIGS. 2A through 2C illustrate one embodiment of an on-chip interconnect 18. Note that the on-chip interconnect 18 may be a segment of a larger on-chip interconnect. FIG. 2A is a top-down view of the on-chip interconnect 18. As illustrated, the on-chip interconnect 18 includes an interconnect segment 20 and a multilevel reservoir 22. Vias 24 and 26 connect anode and cathode ends 28 and 30, respectively, of the interconnect segment 20 to desired nodes of an integrated circuit (not shown). Both the interconnect segment 20 and the multilevel reservoir 22 are formed of a metal such as, but not limited to, Aluminum (Al) or Copper (Cu). Note that while the interconnect segment 20 and the multilevel reservoir 22 are described herein as being formed of a metal such as, but not limited to, Aluminum (Al) or Copper (Cu), these metals may be used in combination with layers of materials such as Titanium Nitride (TiN) or Tantalum (Ta), that serve functions such as diffusion barriers, adhesion layers and/or antireflection coatings, as will be appreciated by one of ordinary skill in the art upon reading this disclosure. The multilevel reservoir 22 is formed adjacent to the cathode end 30 of the interconnect segment 20 and away from the interconnect segment 20. Preferably, the interconnect segment 20 and the multilevel reservoir 22 form a contiguous segment of metal. In addition, the multilevel reservoir 22 is preferably an inactive reservoir in that electric current does not flow through the multilevel reservoir 22. While FIGS. 2A through 2C illustrate the multilevel reservoir 22 extending below the interconnect segment 20, it should be appreciated that the multilevel reservoir 22 may extend below the interconnect segment 20, extend above the interconnect segment 20, or extend both above and below the interconnect segment 20.

FIG. 2B is a side-view of the on-chip interconnect 18 of FIG. 2A. As illustrated, the multilevel reservoir 22 has a thickness ($t_R$) that is substantially greater than a thickness ($t_I$) of the interconnect segment 20. Preferably, as discussed below, the multilevel reservoir 22 is formed in two or more levels of an integrated circuit, whereas the interconnect segment 20 is formed in a single level of the integrated circuit. Thus, in other words, the thickness ($t_I$) of the interconnect segment 20 is preferably a thickness of a metal layer in which the interconnect segment 20 is formed, and the thickness ($t_R$) of the multilevel reservoir 22 is preferably the sum of the thicknesses of the metal layer and one or more adjacent layers used to form the multilevel reservoir 22.

FIG. 2C graphically illustrates the manner in which the multilevel reservoir 22 acts as a reservoir of metal atoms in order to prevent, or at least substantially reduce the likelihood of, electromigration-induced void formation at or near the cathode end 30 of the interconnect segment 20. In other words, the multilevel reservoir 22 operates to prevent, or reduce the likelihood, of electromigration-induced void formation in a portion of the interconnect segment 20 adjoining the via 26. As a result, the reliability of the on-chip interconnect 18 is substantially improved as compared to that of traditional on-chip interconnects. More specifically, as illustrated in FIG. 2C, a void 32 resulting from electromigration of metal atoms within the on-chip interconnect 18 is formed in the multilevel reservoir 22 rather than at or near the via 26 at the cathode end 30 of the interconnect segment 20 such that reliability of the on-chip interconnect 18 is substantially improved.

It should also be noted that the use of the multilevel reservoir 22, rather than a single level reservoir, provides substantial benefits. Specifically, a volume of the multilevel reservoir 22 is substantially greater than that of a single layer reservoir having the same area. The increased volume provides greater benefit in terms of prevention of electromigration-induced void formation at or near the via 26 at the cathode end 30 of the interconnect segment 20. Still further, by using the multilevel reservoir 22, the volume of the multilevel reservoir 22 can be relatively large while having minimum impact on a layout density of interconnects for the integrated circuit.

Figure 3A:
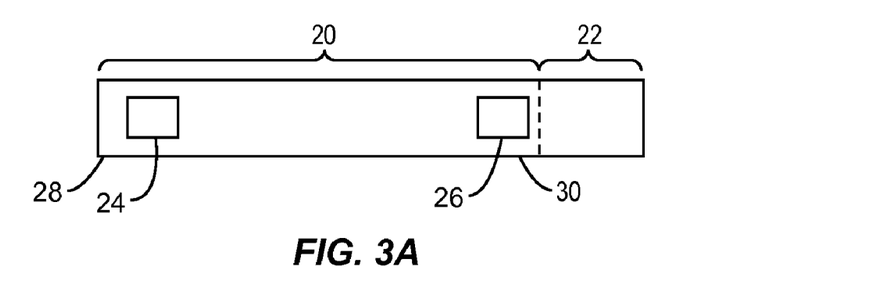
FIGS. 3A through 3C illustrate an on-chip interconnect for an integrated circuit where the on-chip interconnect has a multilevel reservoir according to another embodiment of this disclosure.
Figure 3B:
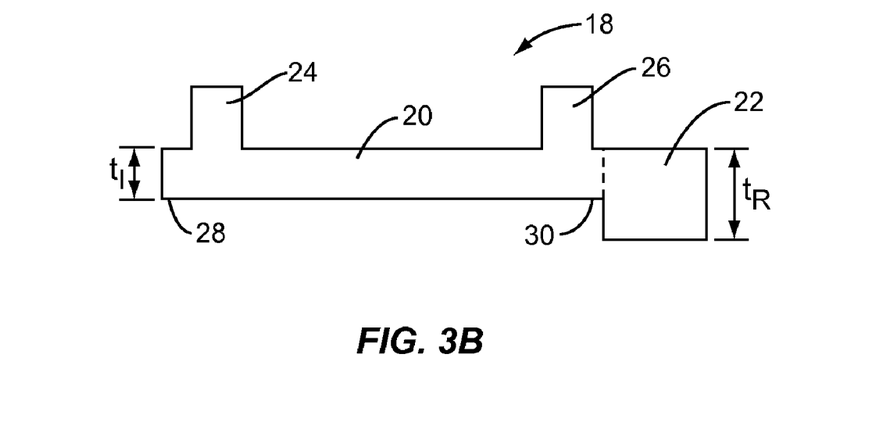
Figure 3C:
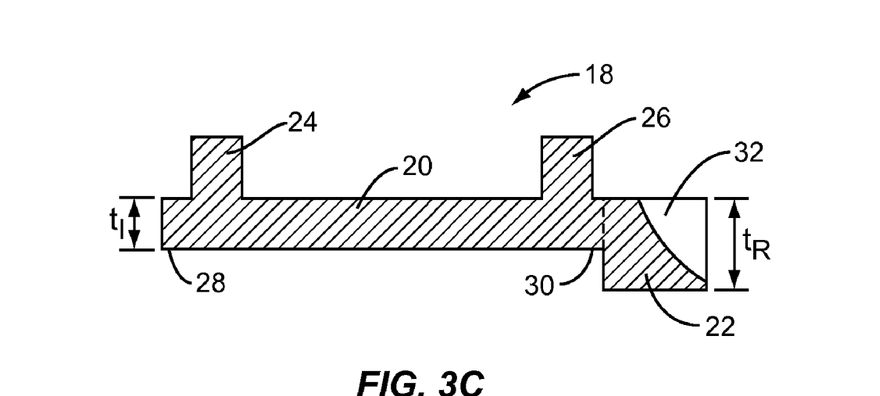

FIGS. 3A through 3C are similar to FIGS. 2A through 2C. FIGS. 2A through 2C illustrate an embodiment of the on-chip interconnect 18 wherein both the via 26 at the cathode end 30 of the interconnect segment 20 and the multilevel reservoir 22 are formed using a level below the interconnect segment 20. In contrast, FIGS. 3A through 3C illustrate an embodiment of the on-chip interconnect 18 wherein the via 26 at the cathode end 30 of the interconnect segment 20 is formed using a level above the interconnect segment 20 whereas the multilevel reservoir 22 is formed using a level below the interconnect segment 20. Thus, in general, the multilevel reservoir 22 and the via 26 at the cathode end 30 of the interconnect segment 20 may be formed using the same adjacent level or different adjacent levels of the integrated circuit. While FIGS. 3A through 3C illustrate the multilevel reservoir 22 extending below the interconnect segment 20, it should be appreciated that the multilevel reservoir 22 may extend below the interconnect segment 20, extend above the interconnect segment 20, or extend both above and below the interconnect segment 20.

FIGS. 4A through 4H graphically illustrate fabrication of an exemplary integrated circuit 34 including an on-chip interconnect having a multilevel reservoir according to one embodiment of this disclosure. Note that many of the processing steps discussed below are generalized for clarity and ease of discussion. In this embodiment, Aluminum (Al) is the metal used for the on-chip interconnects. However, this discussion is equally applicable to other metals, separately or in combination, that may be used with the same or similar fabrication process.

Figure 4A:
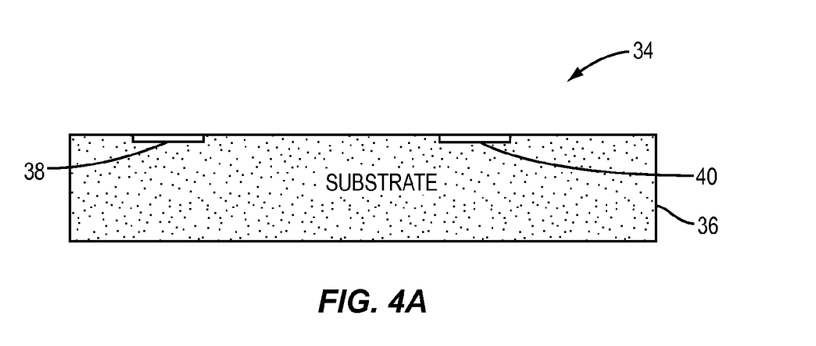
FIGS. 4A through 4H graphically illustrate fabrication of an integrated circuit including an on-chip interconnect having a multilevel reservoir according to one embodiment of this disclosure.
Figure 4B:
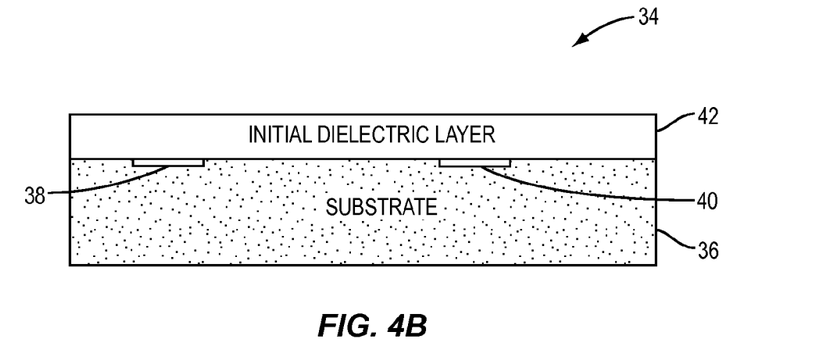
Figure 4C:
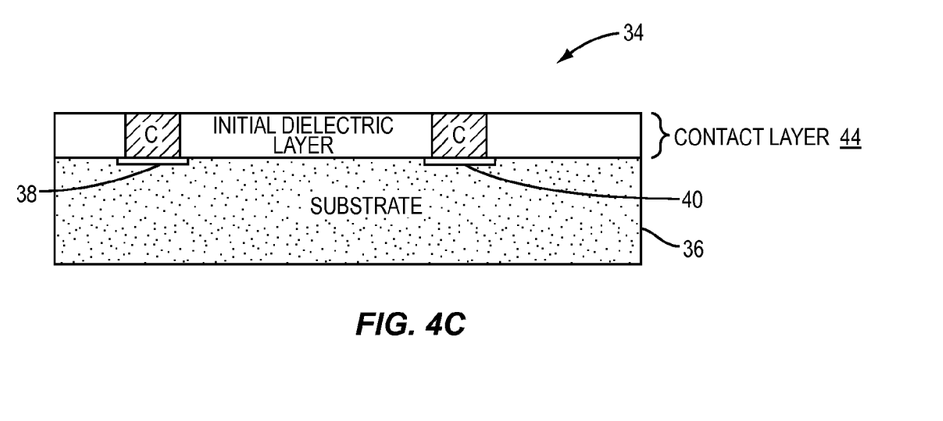

First, as illustrated in FIG. 4A, the integrated circuit 34 begins with a substrate 36 on which a number of electronic devices have been formed. The electronic devices may include, for example, transistors, resistors, inductors, capacitors, or the like. In this example, the substrate 36 is a Silicon (Si) substrate and includes metal silicide areas 38 and 40, which are formed at locations over which contacts are to be formed. Next, as illustrated in FIG. 4B, an initial dielectric layer, or insulation layer, 42 is formed over a top surface of the substrate 36. If the substrate 36 is a Silicon (Si) substrate, the initial dielectric layer 42 may be, for example, Silicon Dioxide ($SiO_2$). Then, as illustrated in FIG. 4C, the initial dielectric layer 42 is etched or similarly processed to form contact holes, and the contact holes are filled with a metal, such as Tungsten (W), or a combination of metals, such as Tungsten (W) in combination with a layer of another metal such as Titanium Nitride (TiN), to form contacts (C). The resulting level is referred to herein as a contact layer 44.

Figure 4D:
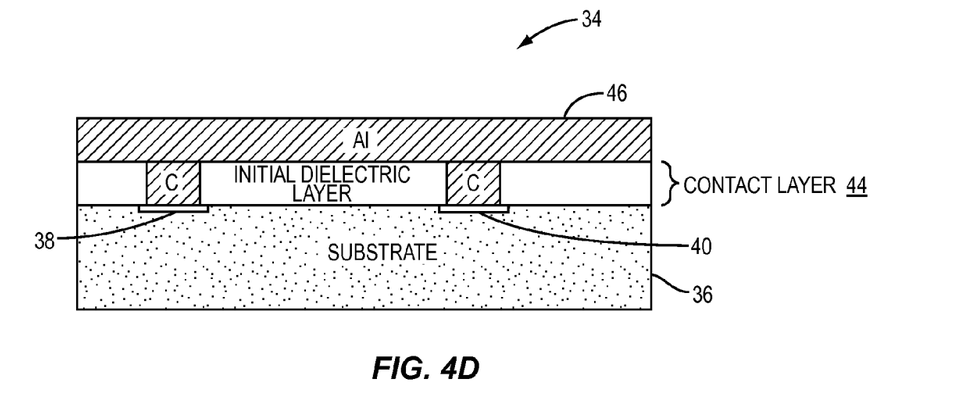
Figure 4E:
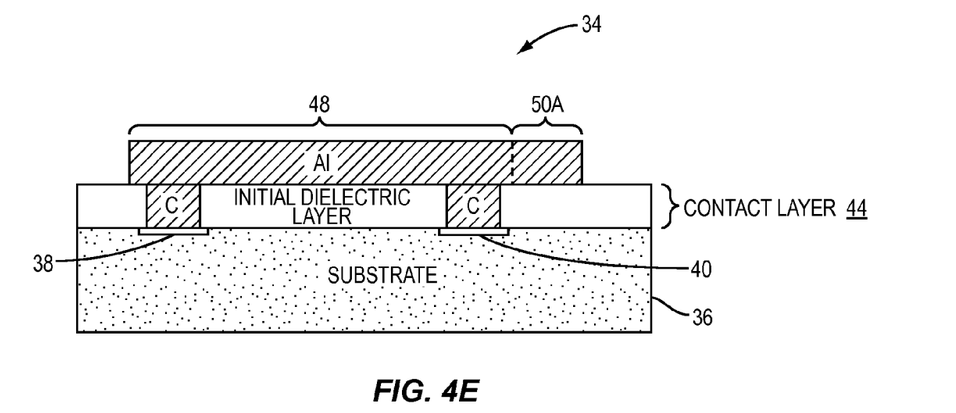
Figure 4F:
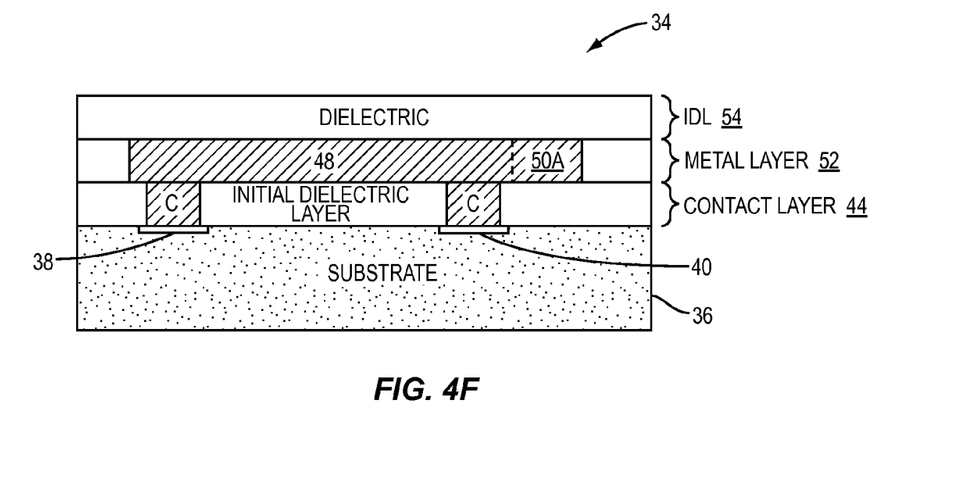

Next, as illustrated in FIG. 4D, a metal 46, which in this embodiment is Aluminum (Al), is deposited on a top surface of the contact layer 44. Then, as illustrated in FIG. 4E, the metal 46 is etched or otherwise patterned to form an interconnect segment 48 and a first portion 50A of a multilevel reservoir for an on-chip interconnect. A dielectric material, such as $SiO_2$, is then deposited over a top surface of the metal 46 and an exposed surface of the contact layer 44 to both surround the etched metal 46 with the dielectric material to complete a metal layer 52 and form an interlevel dielectric layer (ILD) 54, as illustrated in FIG. 4F.

Figure 4G:
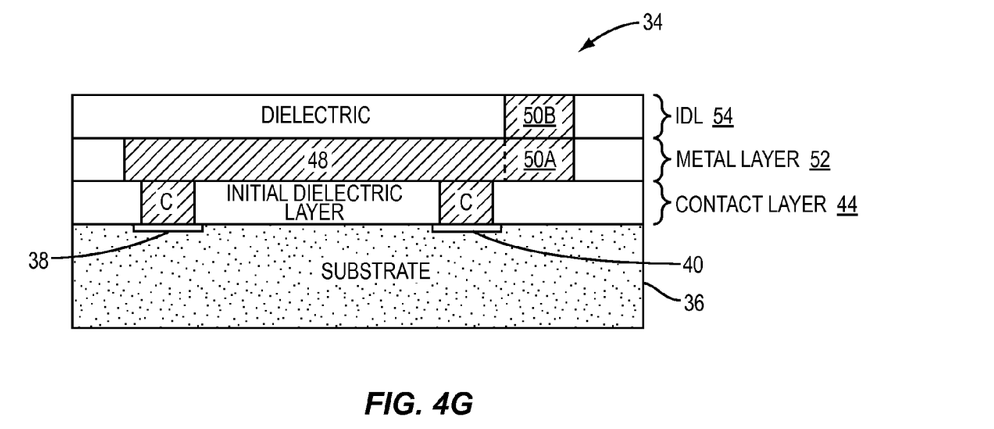

The ILD 54 is then etched or otherwise processed to form a hole over the first portion 50A of the multilevel reservoir for the on-chip contact, and the hole is filled with Aluminum (Al) to form a second portion 50B of the multilevel reservoir for the on-chip contact, as illustrated in FIG. 4G. Together, the first and second portions 50A and 50B form a multilevel reservoir for the on-chip reservoir. In this example, the multilevel reservoir spans two levels of the integrated circuit 34. However, in another embodiment, the multilevel reservoir may span more than two levels of the integrated circuit 34. In the preferred embodiment, the second portion 50B of the multilevel reservoir has the same, or approximately the same, cross-sectional area as the first portion 50A of the multilevel reservoir. However, in another embodiment, the second portion 50B may have a different cross-sectional area than the first portion 50A.

Figure 4H:
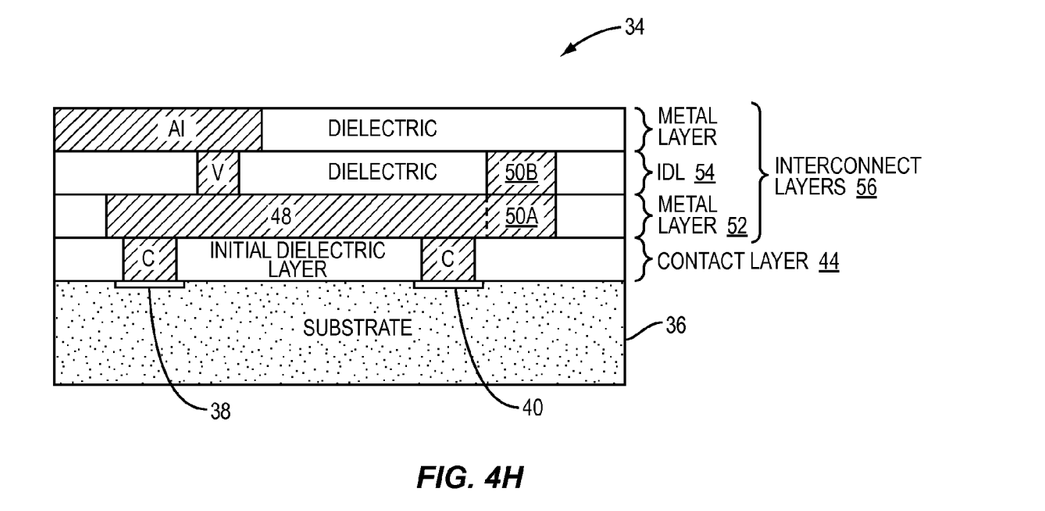

The process may then continue to form additional metal layers and ILDs as desired, as illustrated in FIG. 4H. Vias (V) provide interlevel connections between on-chip interconnects, as will be appreciated by one of ordinary skill in the art upon reading this disclosure. Together, the metal layer 52, the ILD 54, and any additional metal layers and ILDs are referred to herein as interconnect layers 56.

FIGS. 5A through 5G graphically illustrate fabrication of an exemplary integrated circuit 58 including an on-chip interconnect having a multilevel reservoir according to one embodiment of this disclosure. Note that many of the processing steps discussed below are generalized for clarity and ease of discussion. Note that in this embodiment, Copper (Cu) is the metal used for the on-chip interconnects. However, this discussion is equally applicable to other metals that may be used with the same or similar fabrication process.

Figure 5A:
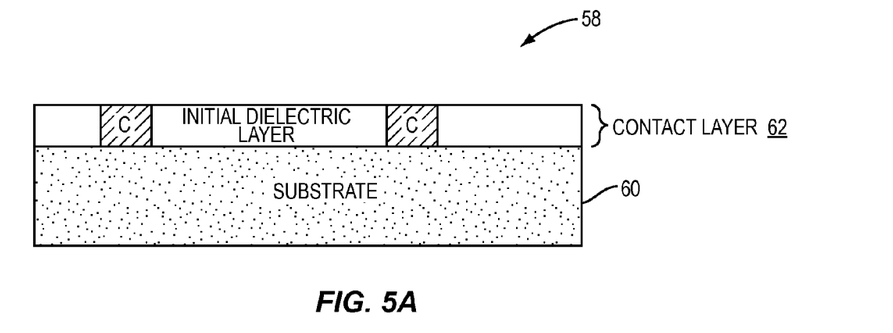
FIGS. 5A through 5F graphically illustrate fabrication of an integrated circuit including an on-chip interconnect having a multilevel reservoir according to another embodiment of this disclosure.
Figure 5B:
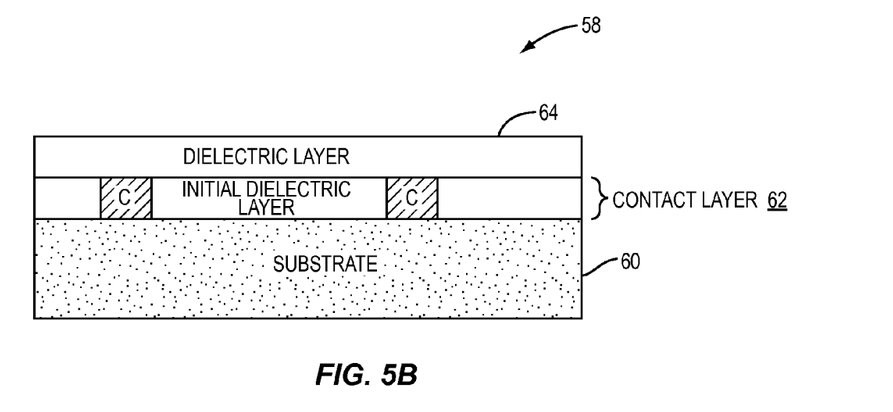
Figure 5C:
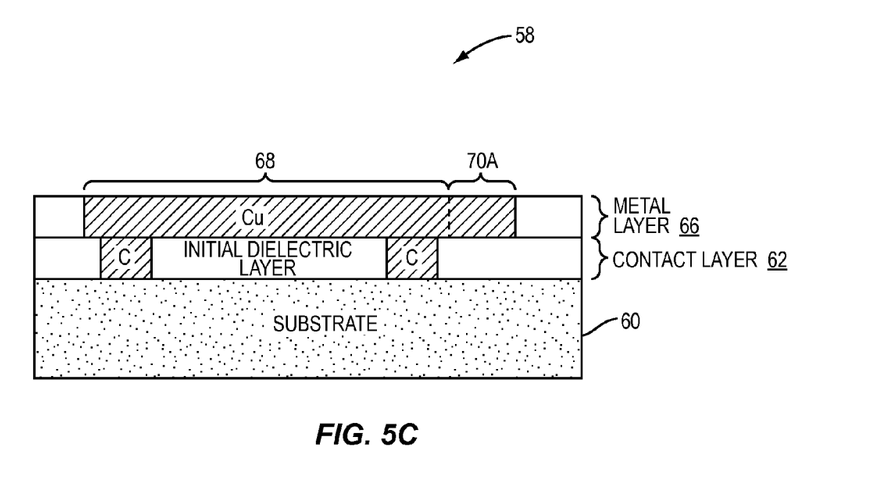

Initially, as illustrated in FIG. 5A, the integrated circuit 58 includes a substrate 60 in which a number of electronic devices have been formed and a contact layer 62 including a number of contacts (C) formed on a top surface of the substrate 60. The contacts (C) may be formed of a metal, such as Tungsten (W), or a combination of metals, such as Tungsten (W) in combination with a layer of another metal such as Titanium Nitride (TiN). As one example, the substrate 60 is a Silicon (Si) substrate and may include metal silicide areas (not shown) formed at locations over which the contacts (C) are to be formed. Next, a dielectric material 64 is deposited over a top surface of the contact layer 62 as illustrated in FIG. 5B. The dielectric material 64 is trenched using a known trenching technique, and one or more resulting trenches are filled with a metal, which in this embodiment is Copper (Cu), to form a metal layer 66, as illustrated in FIG. 5C. More specifically, in order to form an on-chip interconnect having a multilevel reservoir, the dielectric material 64 is trenched such that a trench is formed at a desired location of the on-chip interconnect. The trench is filled with the metal, which in this embodiment is Copper (Cu), to form an interconnect segment 68 and a first portion 70A of the multilevel reservoir for the on-chip interconnect, as illustrated in FIG. 5C.

Figure 5D:
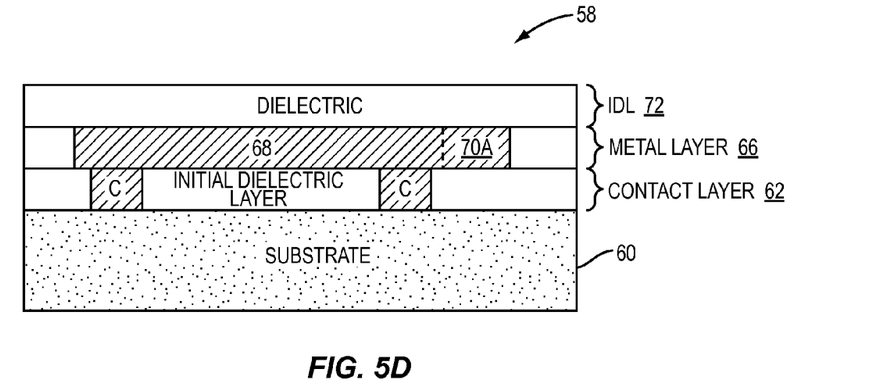
Figure 5E:
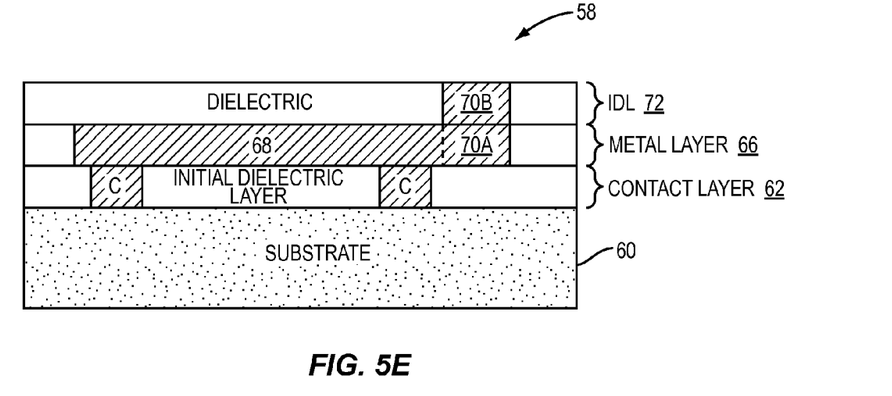

As illustrated in FIG. 5D, a dielectric material is then deposited over the metal layer 66 to form an ILD 72. The ILD 72 is trenched such that a trench is formed over the first portion 70A of the multilevel reservoir of the on-chip interconnect, and the trench is filled with Copper (Cu) in order to form a second portion 70B of the multilevel reservoir of the on-chip interconnect, as illustrated in FIG. 5E. At this point, fabrication of the on-chip interconnect including the interconnect segment 68 and the multilevel reservoir 70A, 70B is complete. While the multilevel reservoir 70A, 70B of this embodiment is formed using two levels of the integrated circuit 58, it should be noted that a multilevel reservoir may be formed using two or more levels. Also, in the preferred embodiment, the second portion 70B of the multilevel reservoir has the same, or approximately the same, cross-sectional area as the first portion 70A of the multilevel reservoir. However, in another embodiment, the second portion 70B may have a different cross-sectional area than the first portion 70A.

Figure 5F:
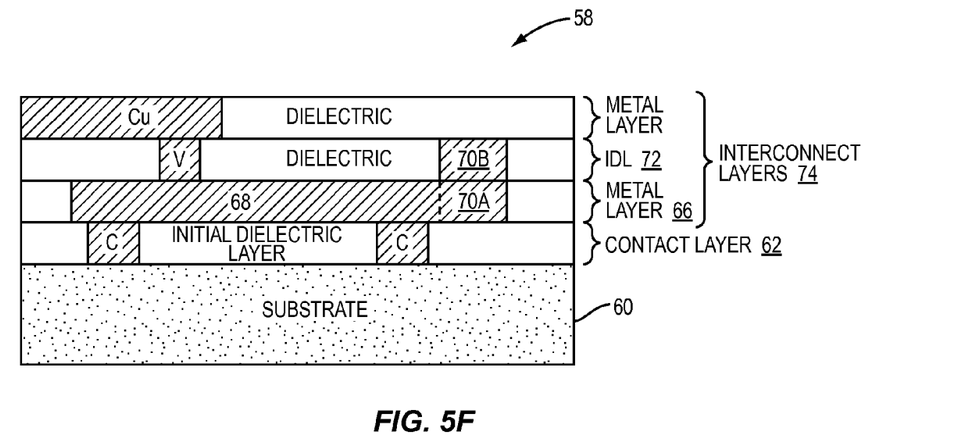

At this point, the process may then continue to form additional metal layers and ILDs as desired, as illustrated in FIG. 5F. Vias (V) provide interlevel connections between on-chip interconnects, as will be appreciated by one of ordinary skill in the art upon reading this disclosure. Together, the metal layer 66, the ILD 72, and any additional metal layers and ILDs are referred to herein as interconnect layers 74.

Figure 6:
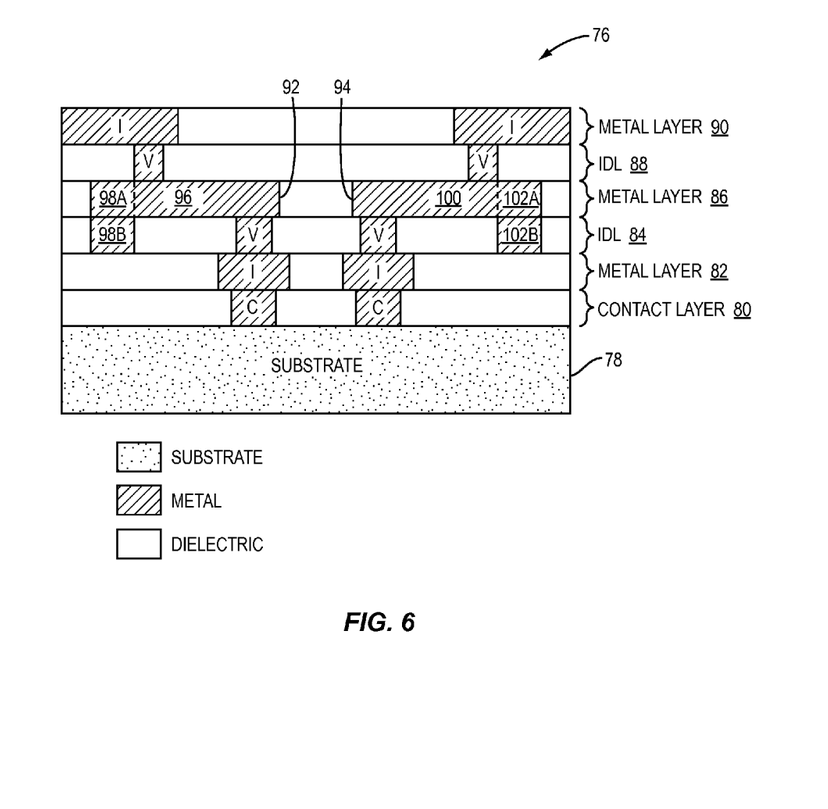
FIG. 6 illustrates an exemplary integrated circuit including an on-chip interconnect having a multilevel reservoir according to yet another embodiment of this disclosure.

FIG. 6 illustrates another exemplary integrated circuit 76 including on-chip interconnects having multilevel reservoirs according to another embodiment of this disclosure. In general, the integrated circuit 76 includes a substrate 78, a contact layer 80, a first metal layer 82, a first ILD 84, a second metal layer 86, a second ILD 88, a third metal layer 90, and on-chip interconnects 92 and 94. A number of electronic devices are formed within the substrate 78. The contact layer 80 includes a number of contacts (C) to the electronic devices formed in the substrate 78. The contacts (C) are formed of a desired metal such as, but not limited to, Tungsten (W) and are surrounded by a dielectric material such as, but not limited to, Silicon Dioxide ($SiO_2$). A number of on-chip interconnects (I) are formed in the first metal layer 82. The on-chip interconnects (I) are formed of a desired metal such as, but not limited to, Aluminum (Al) or Copper (Cu). A dielectric material, such as Silicon Dioxide ($SiO_2$), surrounds the on-chip interconnects (I). Note that the on-chip interconnects (I) in the first metal layer 82 may or may not include multilevel reservoirs as described herein. The first ILD 84 may be formed of a dielectric material such as, but not limited to, Silicon Dioxide ($SiO_2$).

The on-chip interconnect 92 includes an interconnect segment 96 and a first portion 98A of a multilevel reservoir of the on-chip interconnect 92 formed in the second metal layer 86 and a second portion 98B of the multilevel reservoir formed in the first ILD 84. The on-chip interconnect 92 is formed of a desired metal such as, but not limited to, Aluminum (Al) or Copper (Cu). Since the first portion 98A of the multilevel reservoir is formed in the second metal layer 86 and the second portion 98B of the multilevel reservoir is formed in the first ILD 84, the multilevel reservoir of the on-chip interconnect 92 is formed in two levels of the integrated circuit 76. The multilevel reservoir 98A, 98B is formed adjacent to a cathode end of the interconnect segment 96 and away from the interconnect segment 96. In this example, an anode end of the interconnect segment 96 is connected to one of the interconnects (I) in the first metal layer 82 by a via (V). The via (V) may be formed of a desired metal such as, but not limited to, Tungsten (W).

Similarly, the on-chip interconnect 94 includes an interconnect segment 100 and a first portion 102A of a multilevel reservoir of the on-chip interconnect 94 formed in the second metal layer 86 and a second portion 102B of the multilevel reservoir formed in the first ILD 84. The on-chip interconnect 94 is formed of a desired metal such as, but not limited to, Aluminum (Al) or Copper (Cu). Since the first portion 102A of the multilevel reservoir is formed in the second metal layer 86 and the second portion 102B of the multilevel reservoir is formed in the first ILD 84, the multilevel reservoir of the on-chip interconnect 94 is formed in two levels of the integrated circuit 76. The multilevel reservoir 102A, 102B is formed adjacent to a cathode end of the interconnect segment 100 and away from the interconnect segment 100. In this example, an anode end of the interconnect segment 100 is connected to one of the interconnects (I) in the first metal layer 82 by a via (V). The via (V) may be formed of a desired metal such as, but not limited to, Tungsten (W).

In this example, on-chip interconnects (I) are also formed in the third metal layer 90. The on-chip interconnects (I) are formed of a desired metal such as Aluminum (Al) or Copper (Cu) and may or may not have multilevel reservoirs as described herein. The on-chip interconnects (I) in the third metal layer 90 are connected to the on-chip interconnects 92 and 94 in the second metal layer 86 by vias (V) formed in the second ILD 88.

Figure 7:
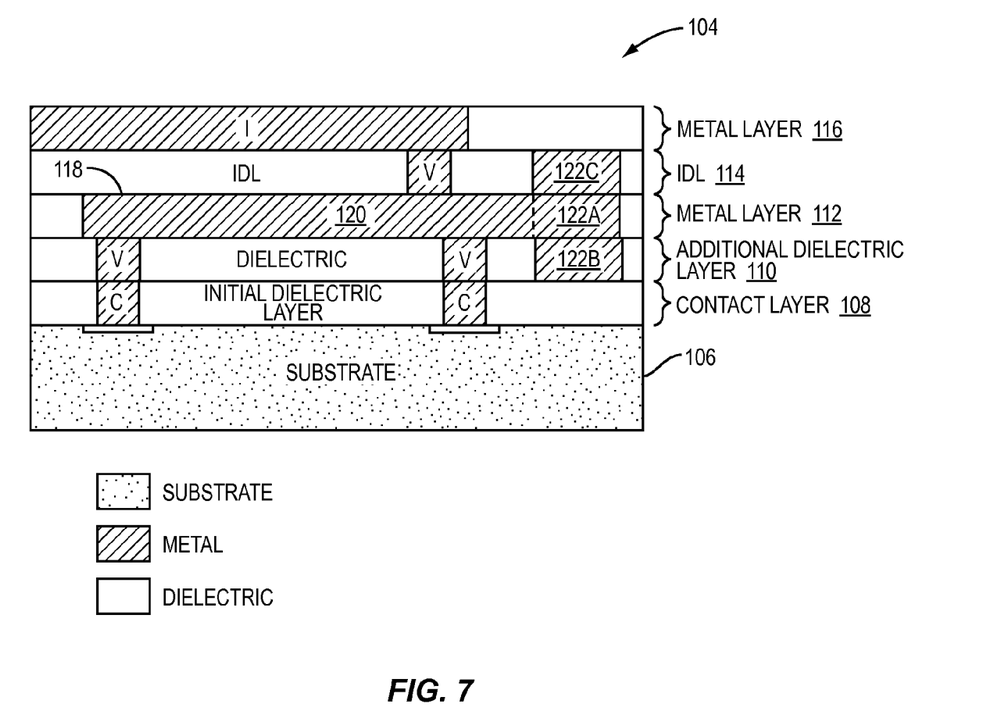
FIG. 7 illustrates an exemplary integrated circuit including an on-chip interconnect having a multilevel reservoir according to yet another embodiment of this disclosure.

FIG. 7 illustrates another exemplary integrated circuit 104 including an on-chip interconnect having a multilevel reservoir according to one embodiment of this disclosure. As illustrated, the integrated circuit 104 includes a substrate 106, a contact layer 108, an additional dielectric layer 110, a first metal layer 112, an ILD 114, and a second metal layer 116. A number of electronic devices are formed within the substrate 106. The contact layer 108 includes a number of contacts (C) to the electronic devices formed in the substrate 106. The contacts (C) are formed of a desired metal such as, but not limited to, Tungsten (W) and are surrounded by a dielectric material such as, but not limited to, Silicon Dioxide (SiO$_2$).

An on-chip interconnect 118 is formed of a metal such as, but not limited to, Aluminum (Al) or Copper (Cu). The on-chip interconnect 118 includes an interconnect segment 120 formed in the first metal layer 112. The on-chip interconnect 118 also includes a multilevel reservoir including a first portion 122A formed in the first metal layer 112 and a second portion 122B formed in the additional dielectric layer 110. The additional dielectric layer 110 enables the second portion 122B of the multilevel reservoir to be formed below the interconnect segment 120 (i.e., formed in the level below the level in which the interconnect segment 120 is formed). Otherwise, the second portion 122B would contact a top surface of the substrate 106, which is undesirable. Note that an additional dielectric layer, like the additional dielectric layer 110, may similarly be used in higher levels within the integrated circuit 104 to prevent multilevel reservoirs from causing undesirable short-circuits between two on-chip interconnects.

In addition, in this embodiment, the multilevel reservoir of the on-chip interconnect 118 includes a third portion 122C formed in the ILD 114. Since the first portion 122A of the multilevel reservoir is formed in the first metal layer 112, the second portion 122B of the multilevel reservoir is formed in the additional dielectric layer 110, and the third portion 122C of the multilevel reservoir is formed in the ILD 114, the multilevel reservoir of the on-chip interconnect 118 is formed in three levels of the integrated circuit 104. The multilevel reservoir 122A, 122B, 122C is formed adjacent to a cathode end of the interconnect segment 120 and away from the interconnect segment 120. In this example, an anode end of the interconnect segment 120 is connected to one of the contacts (C) in the contact layer 108 by a via (V). The cathode end of the interconnect segment 120 is connected to an interconnect (I) in the second metal layer 116 by a via (V) in the ILD 114.

Those skilled in the art will recognize improvements and modifications to the embodiments of the present invention. All such improvements and modifications are considered within the scope of the concepts disclosed herein and the claims that follow.

What is claimed is:

1. An on-chip interconnect for an integrated circuit comprising:
   an interconnect segment having an anode end and a cathode end, the interconnect segment being formed of metal within a metal layer of the integrated circuit; and
   a multilevel reservoir that is electrically inactive and is formed of metal within at least two levels of the integrated circuit, which include the metal layer, such that the multilevel reservoir is adjacent to the cathode end of the interconnect segment on a side of the cathode end of the interconnect segment that is away from the anode end of the interconnect segment.

2. The on-chip interconnect of claim 1 wherein the interconnect segment and the multilevel reservoir are formed of the same metal.

3. The on-chip interconnect of claim 1 wherein the interconnect segment and the multilevel reservoir comprise Aluminum.

4. The on-chip interconnect of claim 1 wherein the interconnect segment and the multilevel reservoir comprise Copper.

5. The on-chip interconnect of claim 1 wherein the interconnect segment and the multilevel reservoir are contiguous.

6. The on-chip interconnect of claim 1 wherein the multilevel reservoir comprises:
   a first portion formed of metal within the metal layer; and
   a second portion formed of metal within a dielectric layer, the dielectric layer being adjacent to the metal layer within the integrated circuit.

7. The on-chip interconnect of claim 1 wherein the multilevel reservoir is a reservoir of metal atoms such that an electromigration-induced void begins forming in the multilevel reservoir rather than the interconnect segment.

8. A method of fabricating an on-chip interconnect for an integrated circuit comprising:
   forming an interconnect segment and a first portion of an electrically inactive multilevel reservoir in a metal layer within the integrated circuit such that the first portion of the electrically inactive multilevel reservoir is adjacent to a cathode end of the interconnect segment on a side of the cathode end of the interconnect segment that is away from an anode end of the interconnect segment; and
   forming a second portion of the electrically inactive multilevel reservoir in a dielectric layer within the integrated circuit that is adjacent to the metal layer.

9. The method of claim 8 wherein:
   forming the interconnect segment and the first portion of the electrically inactive multilevel reservoir comprises forming the interconnect segment and the first portion of the electrically inactive multilevel reservoir of a metal; and
   forming the second portion of the electrically inactive multilevel reservoir comprises forming the second portion of the electrically inactive multilevel reservoir of the metal.

10. The method of claim 8 wherein:
    forming the interconnect segment and the first portion of the electrically inactive multilevel reservoir comprises forming the interconnect segment and the first portion of the electrically inactive multilevel reservoir of at least one metal comprising Aluminum; and
    forming the second portion of the electrically inactive multilevel reservoir comprises forming the second portion of the electrically inactive multilevel reservoir of at least one metal comprising Aluminum.

11. The method of claim 8 wherein:
forming the interconnect segment and the first portion of the electrically inactive multilevel reservoir comprises forming the interconnect segment and the first portion of the electrically inactive multilevel reservoir of at least one metal comprising Copper; and
forming the second portion of the electrically inactive multilevel reservoir comprises forming the second portion of the electrically inactive multilevel reservoir of at least one metal comprising Copper.

12. The method of claim 8 wherein:
forming the interconnect segment and the first portion of the electrically inactive multilevel reservoir comprises forming the interconnect segment and the first portion of the electrically inactive multilevel reservoir such that the interconnect segment and the first portion of the electrically inactive multilevel reservoir are contiguous; and
forming the second portion of the electrically inactive multilevel reservoir comprises forming the second portion of the electrically inactive multilevel reservoir such that the second portion of the electrically inactive multilevel reservoir is contiguous with the first portion of the electrically inactive multilevel reservoir.

13. The method of claim 8 wherein the electrically inactive multilevel reservoir is a reservoir of metal atoms such that an electromigration-induced void begins forming in the electrically inactive multilevel reservoir rather than the interconnect segment.

* * * * *